United States Patent
Lin et al.

(10) Patent No.: US 10,783,962 B2
(45) Date of Patent: Sep. 22, 2020

(54) RESISTIVE MEMORY STORAGE APPARATUS AND WRITING METHOD THEREOF INCLUDING DISTURBANCE VOLTAGE

(71) Applicant: Winbond Electronics Corp., Taichung (TW)

(72) Inventors: Lih-Wei Lin, Taichung (TW); Lung-Chi Cheng, Taichung (TW); Min-Yen Liu, Taichung (TW); Huan-Ming Chiang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/105,991

(22) Filed: Aug. 21, 2018

(65) Prior Publication Data
US 2019/0074059 A1    Mar. 7, 2019

(30) Foreign Application Priority Data
Sep. 1, 2017   (CN) .......................... 2017 1 0777435

(51) Int. Cl.
   *G11C 13/00*      (2006.01)
   *H01L 45/00*      (2006.01)

(52) U.S. Cl.
   CPC ........ *G11C 13/004* (2013.01); *G11C 13/0033* (2013.01); *G11C 13/0064* (2013.01); *G11C 13/0069* (2013.01); *G11C 13/0097* (2013.01); *H01L 45/1253* (2013.01); *G11C 13/0007* (2013.01); *G11C 2013/0045* (2013.01); *G11C 2013/0092* (2013.01)

(58) Field of Classification Search
   CPC ........ G11C 2013/0045; G11C 13/0033; G11C 13/0097; G11C 13/0004; G11C 13/0064; G11C 13/0069; G11C 13/0007
   USPC ....................................................... 365/148
   See application file for complete search history.

(56) References Cited

U.S. PATENT DOCUMENTS

| 8,773,888 | B2 | 7/2014 | Chang et al. |
| 8,873,275 | B2 | 10/2014 | Ichihara |
| 8,947,905 | B2 | 2/2015 | Chang et al. |
| 9,087,575 | B2 | 7/2015 | Park et al. |

(Continued)

FOREIGN PATENT DOCUMENTS

| CN | 102915762 | 2/2013 |
| CN | 104412326 | 3/2015 |

(Continued)

*Primary Examiner* — Alfredo Bermudez Lozada
(74) *Attorney, Agent, or Firm* — JCIPRNET

(57) ABSTRACT

A writing method of a resistive memory storage apparatus includes: applying one of a set voltage and a reset voltage serving as a first selected voltage to a memory cell and obtaining a first read current; applying a disturbance voltage to the memory cell and obtaining a second read current; and determining whether a relationship between the first and second read currents satisfies a preset relationship, and if not, applying the other of the set voltage and the reset voltage serving as a second selected voltage to the memory cell and applying the first selected voltage to the memory cell again. A polarity of the disturbance voltage is different from that of the first selected voltage, and the absolute value of the disturbance voltage is less than that of the second selected voltage. A resistive memory storage apparatus is also provided.

14 Claims, 5 Drawing Sheets

(56) References Cited

U.S. PATENT DOCUMENTS

| | | | |
|---|---|---|---|
| 9,240,236 B1 | 1/2016 | Barabash et al. | |
| 9,595,327 B2 | 3/2017 | Sugimae et al. | |
| 2013/0051164 A1* | 2/2013 | Chang | G11C 11/5685 365/189.16 |
| 2014/0233299 A1* | 8/2014 | Lan | G11C 13/0064 365/148 |
| 2014/0293678 A1 | 10/2014 | Orlowski et al. | |
| 2015/0262661 A1 | 9/2015 | Chu et al. | |
| 2016/0260482 A1* | 9/2016 | Sugimae | G11C 13/0097 |

FOREIGN PATENT DOCUMENTS

| | | |
|---|---|---|
| TW | 201539453 | 10/2015 |
| TW | I582773 | 5/2017 |
| WO | 2009145308 | 10/2011 |

* cited by examiner

RESISTIVE MEMORY STORAGE APPARATUS AND WRITING METHOD THEREOF INCLUDING DISTURBANCE VOLTAGE

CROSS-REFERENCE TO RELATED APPLICATION

This application claims the priority benefit of China application serial no. 201710777435.0, filed on Sep. 1, 2017. The entirety of the above-mentioned patent application is hereby incorporated by reference herein and made a part of this specification.

BACKGROUND OF THE INVENTION

1. Field of the Invention

The invention relates to a memory storage apparatus and a writing method of the memory storage apparatus, and particularly relates to a resistive memory storage apparatus and a writing method of the resistive memory storage apparatus.

2. Description of Related Art

In recent years, resistive memories (e.g., resistive random access memory, RRAM) undergo a rapid development and are the most promising memory structure of the future. Due to the characteristics such as low power consumption, high operation speed, high density, and compatibility with manufacturing technologies of complementary metal oxide semiconductor (CMOS), resistive memories fit well as the non-volatile memory apparatuses of the next generation.

Currently, a conventional resistive memory normally includes an upper electrode and a lower electrode disposed to be opposite to each other and a dielectric layer between the upper electrode and the lower electrode. Before the conventional resistive memory is able to repetitively switch between high and low resistance states to store data, a process of current path formation is required. The process of current path formation includes applying a bias voltage, such as a positive bias voltage, to the resistive memory, so that a current flows from the upper electrode to the lower electrode and an oxygen vacancy and an oxygen ion are thus generated in the dielectric layer. Accordingly, a current path (conductive filament) is formed and the resistive memory is switched from a high resistance state (HRS) to a low resistance state (LRS). Normally, in the conductive filament, it is presumed that a diameter of a portion near the upper electrode is less than a diameter of a portion near the lower electrode. Then, the resistive memory may be reset or set to respectively switch the resistive memory to the HRS and the LRS, so as to store data. In addition, when resetting the conventional resistive memory, a reverse bias voltage having a polarity opposite to a polarity of a bias voltage for setting is applied to the resistive memory. Accordingly, the current flows from the lower electrode to the upper electrode. Under the circumstance, the oxygen vacancy is combined with some of the oxygen ions, and the current path is disconnected at a proximity of the upper electrode. When setting the conventional resistive memory, the bias voltage having a polarity same as a polarity of a bias voltage for forming the conductive filament is applied. Accordingly, the current flows from the upper electrode to the lower electrode. Under the circumstance, the oxygen ion at a proximity of the upper electrode is released, and the oxygen vacancy is formed again. Hence, the filament is formed at a proximity of the upper electrode again.

However, currently, after setting the conventional resistive memory, even though a great read current can be obtained when reading a memory cell in the LRS, whether the filament of the memory cell in the LRS is robust enough to pass tests on high temperature data retention (HTDR) ability and endurance is unknown. Similarly, after resetting the conventional resistive memory, even though a small read current can be obtained when reading a memory cell in the HRS, whether the filament of the memory cell having the HRS is robust enough to pass tests on HTDR ability and endurance is unknown.

SUMMARY OF THE INVENTION

The invention provides a resistive memory storage apparatus and a writing method of the resistive memory storage apparatus having a robust filament as well as a desirable HTDR ability and endurance.

A writing method of a resistive memory storage apparatus according to an embodiment of the invention includes: applying one of a set voltage and a reset voltage serving as a first selected voltage to a memory cell and obtaining a first read current; applying a disturbance voltage to the memory cell and obtaining a second read current of the memory cell; and determining whether a relationship between the first read current and the second read current satisfies a preset relationship, wherein when the relationship between the first read current and the second read current does not satisfy the preset relationship, the other of the set voltage and the reset voltage serving as a second selected voltage is applied to the memory cell, and the first selected voltage is applied to the memory cell again. A polarity of the disturbance voltage is different from a polarity of the first selected voltage, and the absolute value of the disturbance voltage is less than the absolute value of the second selected voltage.

A resistive memory storage apparatus according to an embodiment of the invention includes a memory cell array and a memory control circuit. The memory cell array includes a memory cell. The memory control circuit is coupled to the memory cell array. The memory control circuit applies one of a set voltage and a reset voltage serving as a first selected voltage to a memory cell and obtains a first read current of the memory cell. The memory control circuit applies a disturbance voltage to the memory cell and obtains a second read current of the memory cell. The memory control circuit determines whether a relationship between the first read current and the second read current satisfies a preset relationship. When the relationship between the first read current and the second read current does not satisfy the preset relationship, the memory control circuit applies a second selected voltage of the set voltage and the reset voltage to the memory cell, and applies the first selected voltage to the memory cell again. A polarity of the disturbance voltage is different from a polarity of the first selected voltage, and the absolute value of the disturbance voltage is less than the absolute value of the second selected voltage.

Based on the above, in the exemplary embodiments of the invention, the memory control circuit determines whether to apply the second selected voltage and apply the first selected voltage again based on the relationship between the read currents of the memory cell before and after the disturbance voltage has been applied, so as to maintain the HTDR ability of the memory storage apparatus and optimize the endurance of the memory storage apparatus.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
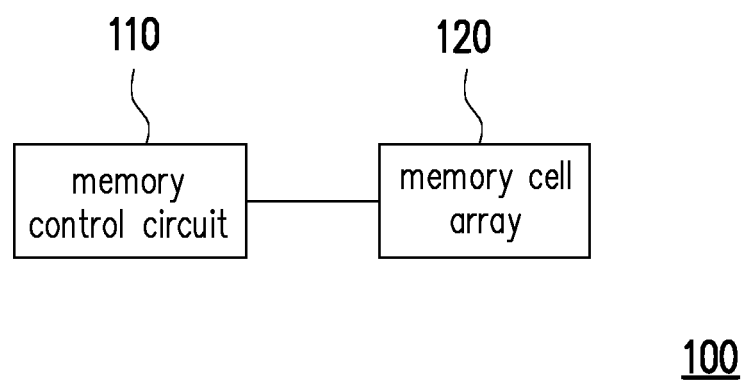
FIG. 1 is a schematic view illustrating a memory storage apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

The following will describe a plurality of embodiments as examples of the invention, but the invention is not limited by the embodiments described herein. In addition, the embodiments may be properly combined with each other. Throughout the specification of the invention (including claims), the term "couple" refers to any direct or indirect connection means. For example, if it is described that a first apparatus is coupled to a second apparatus, it shall be interpreted that the first apparatus may be directly connected to the second apparatus or the first apparatus may be indirectly connected to the second apparatus through another apparatus or a connection means.

Figure 2:
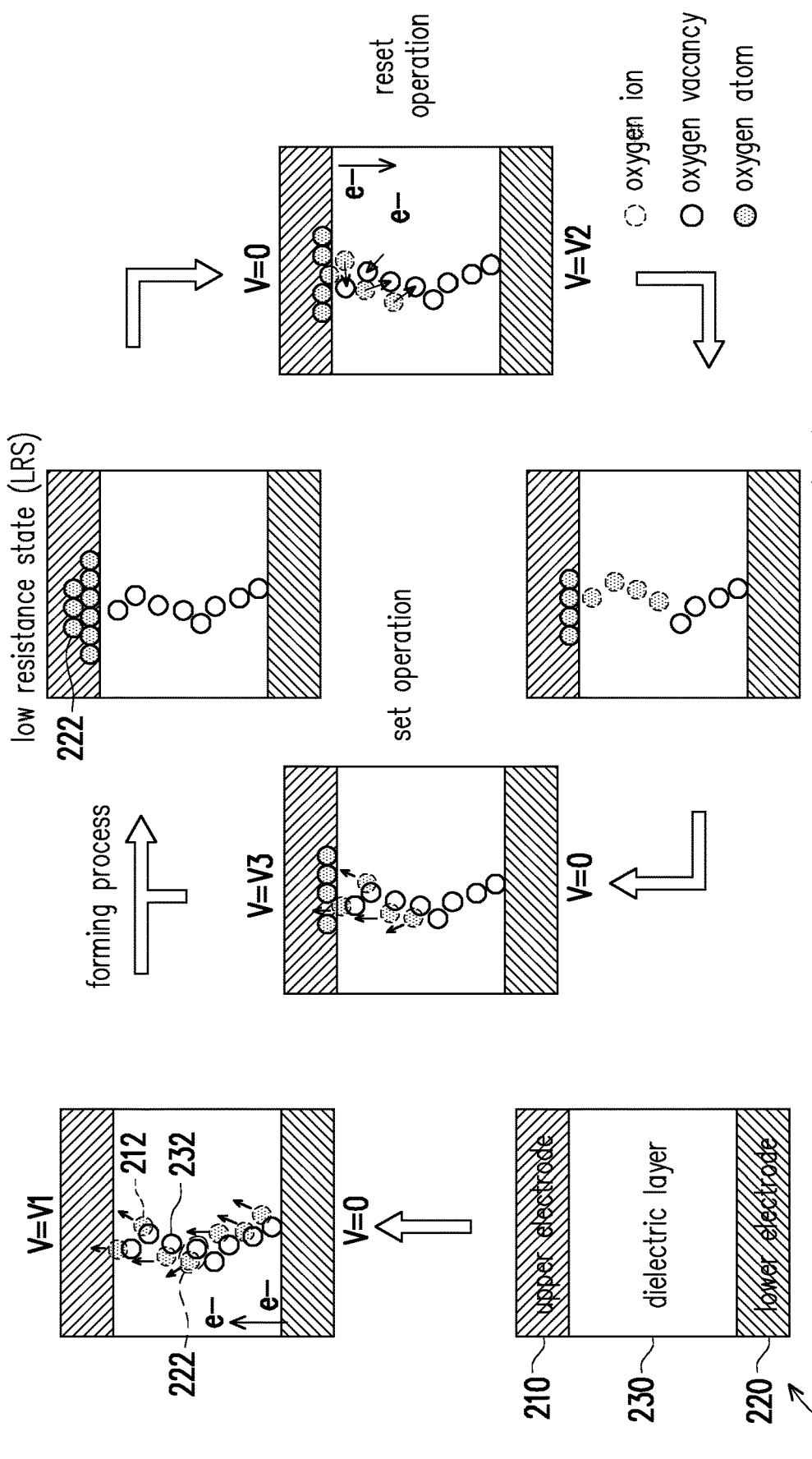
FIG. 2 is a schematic view illustrates that a filament in a memory cell according to an embodiment of the invention undergoes a forming process, a reset operation and a set operation.

FIG. 1 is a schematic view illustrating a memory storage apparatus according to an embodiment of the invention. FIG. 2 is a schematic view illustrates that a filament in a memory cell according to an embodiment of the invention undergoes a forming process, a reset operation and a set operation. Referring to FIGS. 1 and 2, a memory storage apparatus 100 of the embodiment includes a memory control circuit 110 and a memory cell array 120 coupled to the memory control circuit 110. The memory cell array 120 includes a plurality of memory cells 122 arranged in an array. In the embodiment, the resistive memory cell 122 includes an upper electrode 210, a lower electrode 220, and a dielectric layer 230. The upper electrode 210 and the lower electrode 220 are metal conductors with a desirable conductivity, and may include the same or different materials. The dielectric layer 230 is disposed between the upper electrode 210 and the lower electrode 220. The dielectric layer 230 includes a dielectric material, such as a transition metal oxide (TMO). The memory cell 122 in such structure has at least two resistance states, and different voltages may be respectively applied to the upper electrode 210 and the lower electrode 220 to change the resistance state of the resistive memory cell 122, so as to store data.

In the embodiment, the memory cell 122 has a one-transistor-one-resistor (1T1R) structure or two-transistor-two-resistor (2T2R) structure, for example, and sufficient teaching, suggestions, and descriptions for implementation in connection with the structure of the memory cell can be found by referring to the common knowledge of the field. Thus, the invention does not intend to limit the structure of the memory cell 122.

In the embodiment, the memory control circuit 110 is configured to perform a forming process on the memory cell 122. During the process, a bias voltage V1 (i.e., forming voltage) is constantly applied to the electrodes on two ends of the memory cell 122, to generate an applied electric field at the dielectric layer 230. In the embodiment, a positive voltage whose value is V1 volts (V) is applied to the upper electrode 210, and a voltage of 0 V is applied to the lower electrode 220. The applied electric field may separate an oxygen atom 222 into an oxygen ion 212 and an oxygen vacancy 232. The oxygen vacancy 232 forms a filament in the dielectric layer 230 to serve as a current path. When the applied electric field exceeds a threshold, a dielectric breakdown may occur in the dielectric layer 230, and the memory cell is thus turned from a HRS to a LRS. Since such breakdown is not permanent, a resistance value of the memory cell is still variable.

The memory cell 122 after the forming process is in the LRS. In a reset operation, a voltage of 0V is applied to the upper electrode 210 of the memory cell 122, and a positive voltage of V2 V is applied to the lower electrode 220. Such voltage difference, i.e. −V2 V, between the upper electrode 210 and lower electrode 220 is a reset voltage. The memory cell 122 after the reset operation is turned from the LRS to the HRS. Then, in a set operation, a positive voltage of V3 V is applied to the upper electrode 210 of the memory cell 122, and a voltage of 0V is applied to the lower electrode 220. Such voltage difference, i.e. +V3 V, between the upper electrode 210 and lower electrode 220 is a set voltage. The memory cell 122 after the set operation is turned from the HRS to the LRS.

Besides, the HTDR ability and the endurance of the memory storage apparatus 100 are decisive in terms of reliability testing and commercialization. One of the reasons why the HTDR ability of the memory storage apparatus 100 is lost is that, in a high-temperature environment, the oxygen ion 212 may easily drift from an electrode layer (such as the upper electrode 210) to the dielectric layer 230 and be combined with the oxygen vacancy 232 in the dielectric layer 232 again. Accordingly, the current path in the dielectric layer 230 may be interrupted.

In the exemplary embodiment of the invention, a writing method of a resistive memory storage apparatus includes applying a disturbance voltage to the memory cell 122 after applying reset or set voltages on the memory cell 122 and comparing read currents before and after the disturbance voltage has been applied to determine whether the memory cell 122 already reaches a stable state. Such a writing method helps maintain the HTDR ability of the memory storage apparatus 100 and optimizes the endurance of the memory storage apparatus 100. In the following, various exemplary embodiments are described to explain the writing method of the resistive memory storage apparatus.

Figure 3:
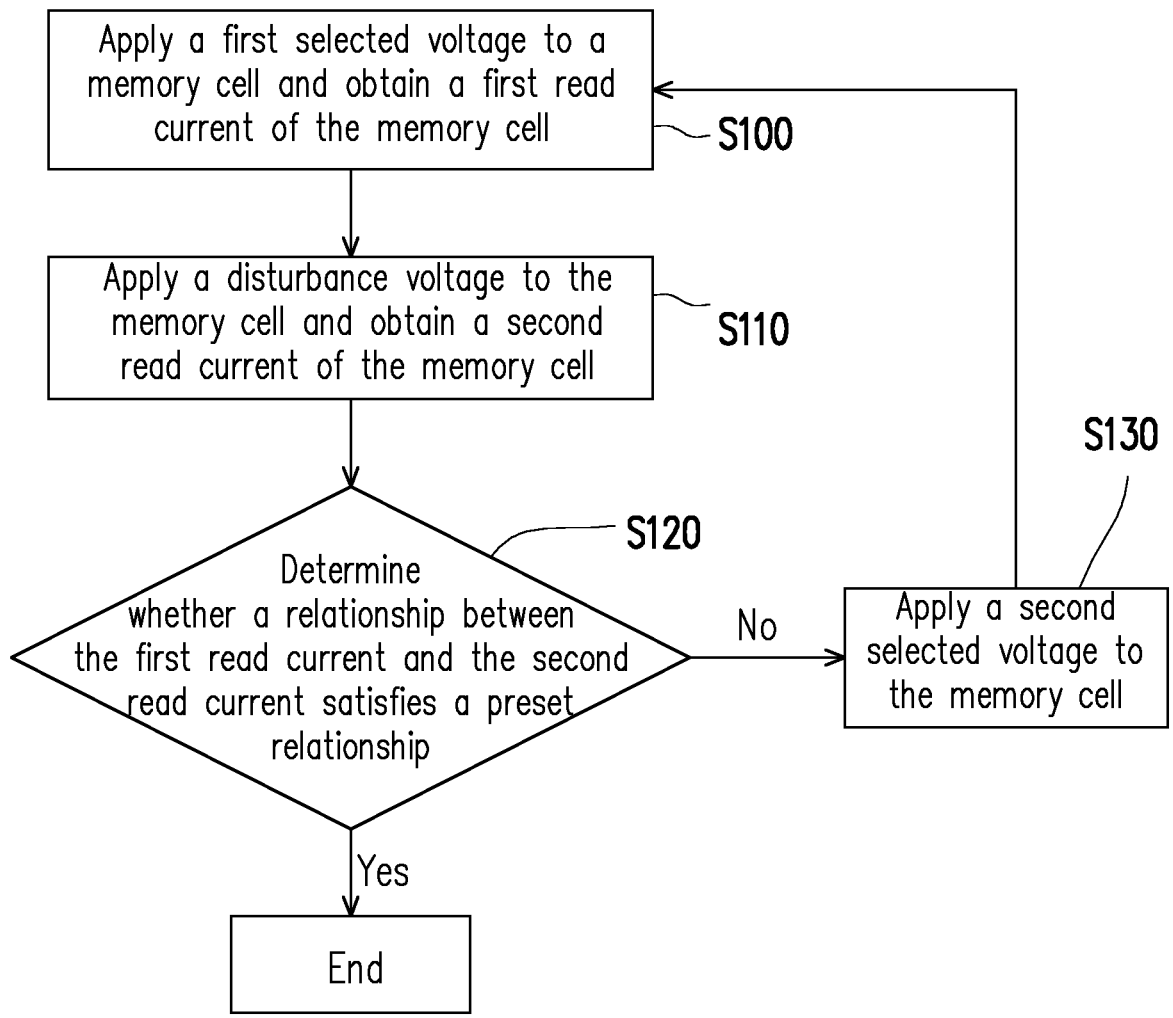
FIG. 3 is a flowchart illustrating a writing method of a memory storage apparatus according to an embodiment of the invention.

FIG. 3 is a flowchart illustrating a writing method of a memory storage apparatus according to an embodiment of the invention. Referring to FIGS. 1 and 3, the writing method is performed by the memory control circuit 110, in the embodiment, at Step S100, the memory control circuit 110 applies one of the set voltage and the reset voltage serving as a first selected voltage to the memory cell 122 and then obtains a first read current I1 of the memory cell 122. If the memory cell 122 is in the HRS, the memory control circuit 110 applies the set voltage to the memory cell 122 to turn the memory cell 122 from the HRS to the LRS. Alternatively, if the memory cell 122 is in the LRS, the memory control circuit 110 applies the reset voltage to the memory cell 122 to turn the memory cell 122 from the LRS to the HRS.

In the embodiment, magnitude of the first selected voltage is determined by amplitude of a gate voltage or a bit line voltage applied to the memory cell 122, for example, or is determined by a pulse width of the first selected voltage. In addition, in the embodiment, the first read current I1 of the memory cell 122 is obtained by applying a read voltage or a verification voltage to the memory cell 122 to detect a current value through the memory cell 122.

Then, at Step S110, the memory control circuit 110 applies a disturbance voltage to the memory cell 122 and obtains a second read current I2 of the memory cell 122. The second read current I2 is obtained in a way similar to the way of obtaining the first read current I1. In the embodiment, a polarity of the disturbance voltage is different from a polarity of the first selected voltage, and an absolute value of the disturbance voltage is less than an absolute value of the other of the set voltage and the reset voltage. For example, if the set voltage is applied to the memory cell 122 at Step S100, the memory control circuit 110 may apply the disturbance voltage (also referred to as a reverse read disturbance) whose absolute value is less than the absolute value of the reset voltage and whose polarity is different from a polarity of the set voltage to the memory cell 122 at Step S110. If the reset voltage is applied to the memory cell 122 at Step S100, the memory control circuit 110 may apply a disturbance voltage whose absolute value is less than the absolute value of the set voltage and whose polarity is different from a polarity of the reset voltage to the memory cell 122 at Step 110.

In another embodiment, the absolute value of the disturbance voltage is greater than a threshold voltage of changing a resistance value of the memory cell 122, so as to disturb the oxygen ion 212 in the memory cell 122 and thus change the resistance value without changing the resistance state of the memory cell 122.

At Step S120, the memory control circuit 110 determines whether a relationship between the first read current I1 and the second read current I2 satisfies a preset relationship. At Step S120, if the relationship between the first read current I1 and the second read current I2 satisfies the preset relationship, the memory control circuit 110 terminates the writing method. If the relationship between the first read current I1 and the second read current I2 does not satisfy the preset relationship, Step S130 is performed. At Step S130, the other of the set voltage and the reset voltage serving as a second selected voltage is applied to the memory cell 122. Then, back to Step S100, the first selected voltage is applied to the memory cell again until the relationship between the first read current I1 and the second read current I2 satisfies the preset relationship.

For example, if the memory cell 122 in the HRS is to be written to the LRS, the set voltage as the first selected voltage may be applied to the memory cell 122 at Step S100, and the preset relationship includes that the second read current I2 is greater than or equal to the first read current I1 (i.e., I2≥I1), for example. At Step S120, if the second read current I2 is greater than or equal to the first read current I1, the memory control circuit 110 terminates the writing method. In other words, the reset voltage as the second selected voltage is not applied to the memory cell 122. If the second read current I2 is less than the first read current I1, the memory control circuit 110 may apply the reset voltage as the second selected voltage to the memory cell 122, and the memory cell 122 is thus reset to the HRS. Then, the flow goes back to Step S100 until the second read current I2 is greater than or equal to the first read current I1. In an embodiment, before applying the set voltage to the memory cell 122 again, the magnitude of the set voltage may be increased, and then the set voltage with increased magnitude is applied to the memory cell 122. In a subsequent set operation, the set voltage with increased magnitude may be provided at the beginning. For example, the absolute value of the set voltage may be increased to increase the magnitude of the set voltage.

Alternatively, if the memory cell 122 in the LRS is to be written to the HRS, the reset voltage as the first selected voltage is applied to the memory cell 122 at Step S100, and the preset relationship includes that the second read current I2 is less than the first read current I1 (i.e., I2<I1). At Step S120, if the second read current I2 is less than the first read current I1, the memory control circuit 110 terminates the writing method. If the second read current I2 is greater than or equal to the first read current I1, the memory control circuit 110 may apply the set voltage serving as the second selected voltage to the memory cell 122, so that the memory cell 122 is set to the LRS. Then, the flow returns to Step S100 until the second read current I2 is less than the first read current I1. In an embodiment, before applying the reset voltage to the memory cell 122 again, the absolute value of the reset voltage may be increased, for example, and then the reset voltage whose absolute value is increased is applied to the memory cell 122. The reset voltage whose absolute value is increased may be provided at the beginning of a subsequent reset operation.

Thus, in the writing method of the memory storage apparatus 100 according to the embodiment, after the reset operation or the set operation is performed on the memory cell 122, the memory control circuit 110 may apply the disturbance voltage to the memory cell 122 and determine whether to perform the reset operation or the set operation on the memory cell 122 again based on the relationship between the read currents of the memory cell 122 before and after the disturbance voltage is applied. Besides, when the reset operation or the set operation is performed again, the amplitude of the reset voltage or the set voltage may be increased, so that the memory cell 122 may satisfy the preset relationship after disturbance is applied again. Such a writing method helps maintain the HTDR ability of the memory storage apparatus 100 and optimizes the endurance of the memory storage apparatus 100.

In the embodiment, the writing method of the memory storage apparatus 100 may also serve as a method to determine whether electrical properties of the memory cell 122 are damaged. For example, if the read currents of the memory cell 122 before and after the disturbance voltage is applied does not satisfy the preset relationship, the memory cell 122 may be damaged. Therefore, in a subsequent data writing operation, the memory control circuit 110 may avoid using such damaged memory cell 122.

Figure 4:
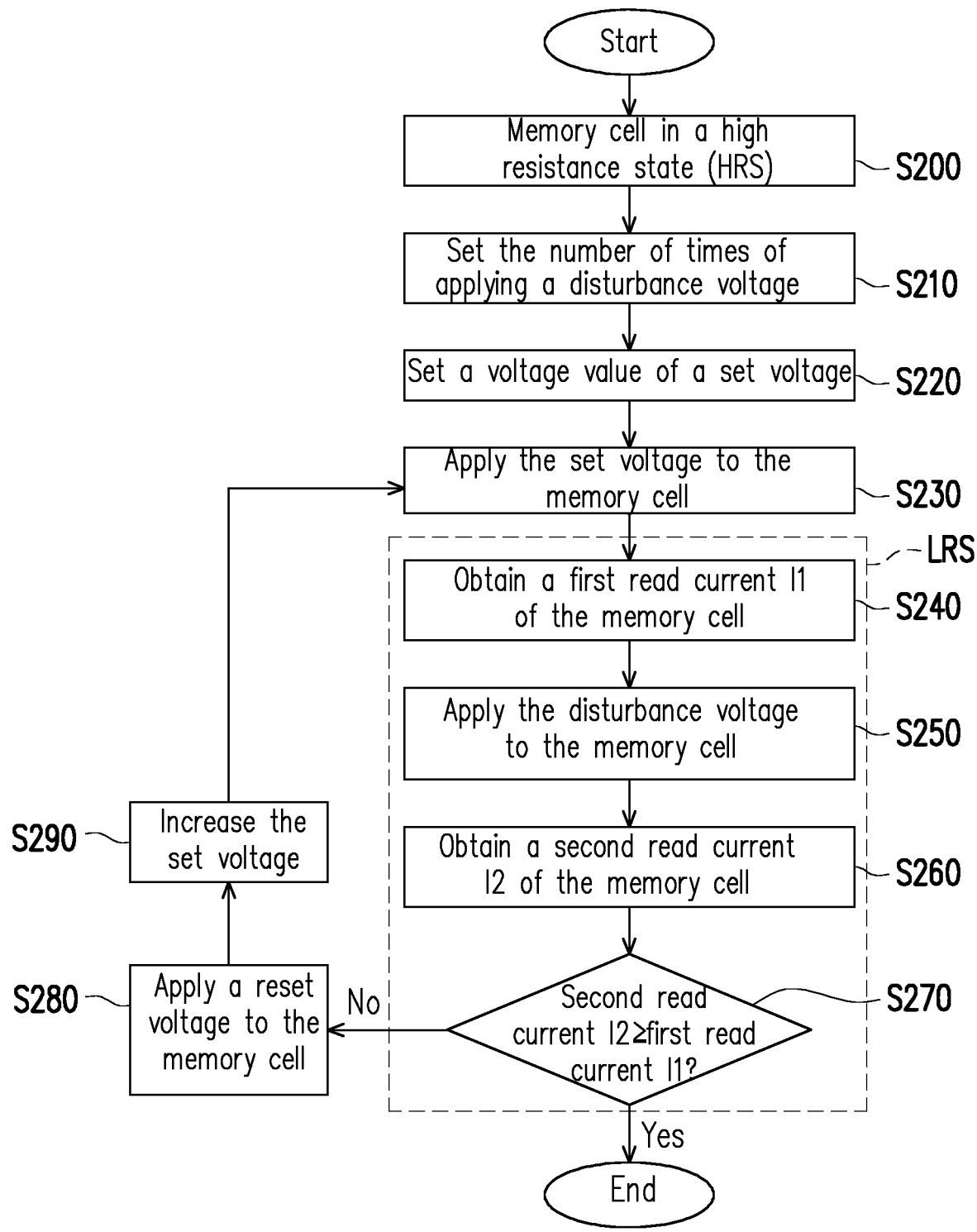
FIG. 4 is a flowchart illustrating a writing method of a memory storage apparatus according to another embodiment of the invention.

FIG. 4 is a flowchart illustrating a writing method of a memory storage apparatus according to another embodiment of the invention. Referring to FIGS. 1 and 4, in the embodiment, the memory control circuit 110 obtains the state of the memory cell 122, such as the HRS, at Step S200. At Step S210, the memory control circuit 110 sets the number of times of applying the disturbance voltage to the memory cell 122 to be one or more (e.g., five or less) times. However, the invention does not intend to limit the number of times. At Step S220, the memory control circuit 110 sets the magnitude of the set voltage. The magnitude of the set voltage is determined based on amplitude of the gate voltage or the bit line voltage applied to the memory cell 122, for example, or determined based on the pulse width of the set voltage, for example. Then, at Step S230, the memory control circuit 110 applies the set voltage to the memory cell 122, so that the memory cell 122 is turned from the HRS to the LRS.

At Step S240, the memory control circuit 110 obtains the first read current I1 of the memory cell 122. At Step S250, the disturbance voltage is applied to the memory cell 122. In the embodiment, the disturbance voltage may be set to be a voltage whose absolute value is less than the absolute value of the reset voltage and whose polarity is different from the polarity of the set voltage. In addition, the disturbance voltage may be greater than the threshold voltage of changing the resistance value of the memory cell 122 without changing the resistance state. At Step S260, the memory control circuit 110 obtains the second read current I2 of the memory cell 122.

At Step S270, the memory control circuit 110 determines whether the second read current I2 is greater than or equal to the first read current I1. In other words, the memory control circuit 110 determines whether the relationship between the first read current I1 and the second read current I2 satisfies the preset relationship. If the second read current I2 is greater than or equal to the first read current I1, the memory control circuit 110 terminates the writing method of the memory storage apparatus 100. In FIG. 4, "LRS" indicates that the memory cell 122 is in the low resistance state at these steps.

If the second read current I2 is less than the first read current I1, the memory control circuit 110 performs Step S280 to apply the reset voltage to the memory cell 122 and turn the memory cell 122 from the LRS to the HRS. In an embodiment, if a reduction of the second read current I2 relative to the first read current I1 is greater than a threshold percentage (e.g., 15%), or the second read current I2 is less than a threshold current intensity (e.g., 30 microampere (µA)), the memory control circuit 110 may determine that the memory cell 122 is not robust enough. Nevertheless, the threshold percentage and the threshold current intensity described herein shall not be construed as limitations on the invention. At Step S290, the memory control circuit 110 increases the set voltage. Then, the memory control circuit 110 performs Step S230 again to apply the increased set voltage to the memory cell 122. Then, the memory control circuit 110 sequentially performs Step S240 to S290 until the second read current I2 is greater than or equal to the first read current I1.

In the embodiment, the memory control circuit 110 sets the number of times of applying the disturbance voltage to the memory cell 122 at Step S210. Therefore, the number of times that the memory control circuit 110 repetitively performs Step S230 to S290 does not exceed the number of times set at Step S210. In an embodiment, the memory control circuit 110 may not repetitively perform Step S230 to S290. In other words, the relationship between the first read current I1 and the second read current I2 satisfies the preset relationship after the disturbance voltage is applied for the first time.

Figure 5:
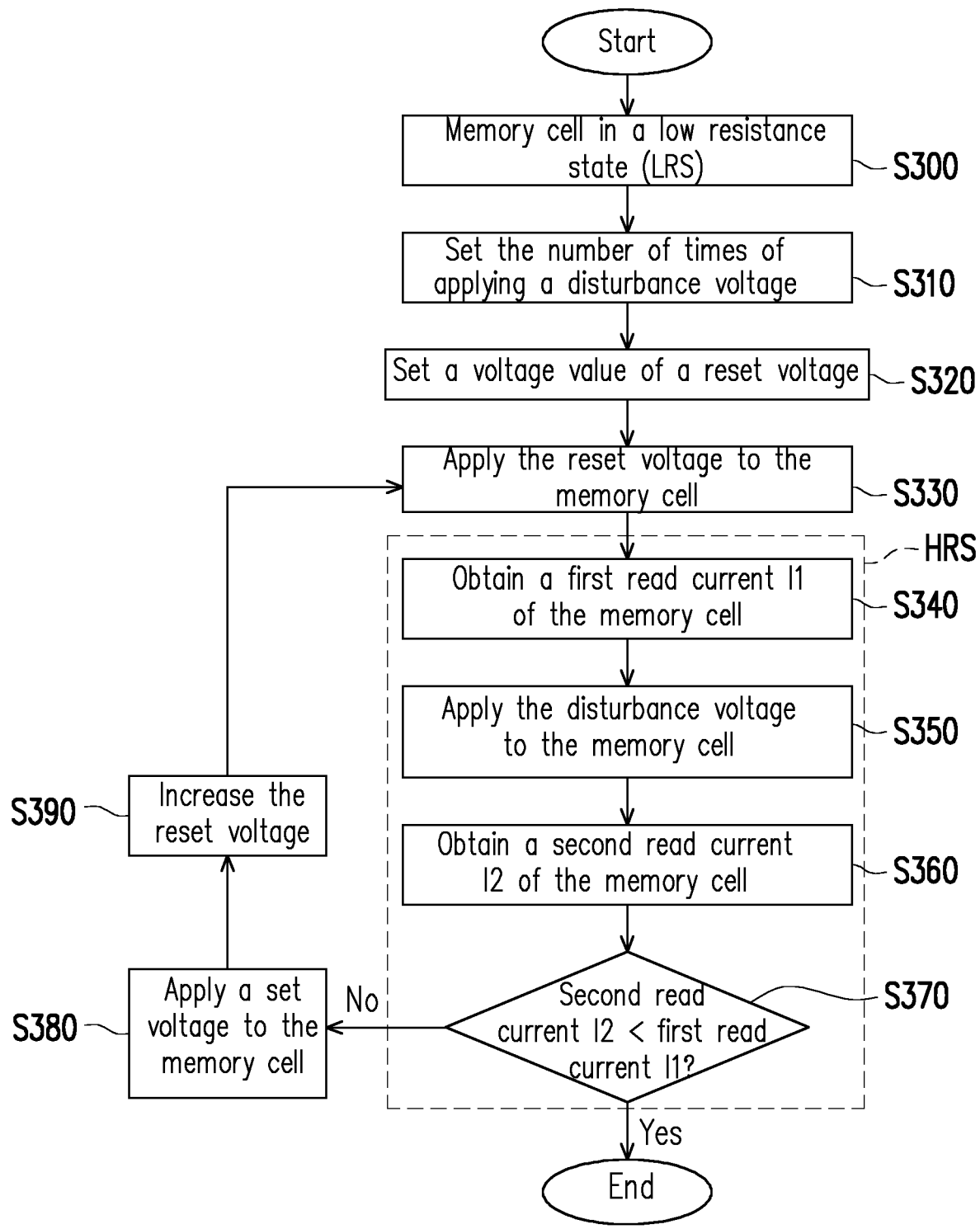
FIG. 5 is a flowchart illustrating a writing method of a memory storage apparatus according to another embodiment of the invention.

FIG. 5 is a flowchart illustrating a writing method of a memory storage apparatus according to another embodiment of the invention. Referring to FIGS. 1 and 5, in the embodiment, the memory control circuit 110 obtains the state of the memory cell 122, such as the LRS, at Step S300. At Step S310, the memory control circuit 110 sets the number of times of applying the disturbance voltage to the memory cell 122 to be one or more (e.g., five or less). However, the invention does not intend to limit the number of times. At Step S320, the memory control circuit 110 sets the magnitude of the reset voltage. The magnitude of the reset voltage is determined based on amplitude of the gate voltage or the bit line voltage applied to the memory cell 122, for example, or determined based on the pulse width of the reset voltage, for example. Then, at Step S330, the memory control circuit 110 applies the reset voltage to the memory cell 122, so that the memory cell 122 is turned from the LRS to the HRS.

At Step S340, the memory control circuit 110 obtains the first read current I1 of the memory cell 122. At Step S350, the disturbance voltage is applied to the memory cell 122. In the embodiment, the disturbance voltage may be set to be a voltage whose absolute value is less than the absolute value of the set voltage and whose polarity is different from the polarity of the reset voltage. In addition, the disturbance voltage may be greater than the threshold voltage of changing the resistance value of the memory cell 122 without changing the resistance state. At Step S360, the memory control circuit 110 obtains the second read current I2 of the memory cell 122.

At Step S370, the memory control circuit 110 determines whether the second read current I2 is less than the first read current I2. In other words, the memory control circuit 110 determines whether the relationship between the first read current I1 and the second read current I2 satisfies the preset relationship. If the second read current I2 is less than the first read current I1, the memory control circuit 110 terminates the writing method of the memory storage apparatus 100. In FIG. 5, "HRS" indicates that the memory cell 122 is in the high resistance state at these steps.

If the second read current I2 is greater than or equal to the first read current I1, the memory control circuit 110 performs Step S380 to apply the set voltage to the memory cell 122 and turn the memory cell 122 from the HRS to the LRS. At Step S390, the memory control circuit 110 increases the reset voltage. Then, the memory control circuit 110 performs Step S330 again to apply the increased reset voltage to the memory cell 122. Then, the memory control circuit 110 sequentially performs Step S340 to S390 until the second read current I2 is less than the first read current I1.

In the embodiment, the memory control circuit 110 sets the number of times of applying the disturbance voltage to the memory cell 122 at Step S310. Therefore, the number of times that the memory control circuit 110 repetitively performs Step S330 to S390 does not exceed the number of times set at Step S310. In an embodiment, the memory control circuit 110 may not repetitively perform Step S330 to S390. In other words, the relationship between the first read current I1 and the second read current I2 satisfies the preset relationship after the disturbance voltage is applied for the first time.

In view of the foregoing, in the exemplary embodiments of the invention, the memory control circuit determines whether to apply the second selected voltage and then apply the first selected voltage again based on the relationship between the read currents of the memory cell before and after the disturbance voltage is applied. The memory control circuit may also apply the disturbance voltage to the memory cell after the magnitude of the disturbance voltage is increased. Also, the memory control circuit may repetitively perform the steps of applying the first selected voltage, the disturbance voltage, and the second selected voltage to the memory cell until the relationship between the read currents of the memory cell before and after the disturbance voltage is applied satisfies the preset relationship and then terminates the writing method. Such writing method is able to maintain the high temperature data retention ability of the memory storage apparatus and optimize the endurance of the memory storage apparatus.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A writing method of a resistive memory storage apparatus, comprising:
   applying one of a set voltage and a reset voltage serving as a first selected voltage to a memory cell to turn the memory cell to a desired resistance state and obtaining a first read current of the memory cell;
   after obtaining the first read current of the memory cell, applying a disturbance voltage to the memory cell without changing the desired resistance state of the memory cell and then applying a read voltage to obtain a second read current of the memory cell;
   comparing the second read current to the first read current to obtain a comparison result; and
   determining whether the desired resistance state of the memory cell is stable according to the comparison result, wherein when the desired resistance state of the memory cell is determined as not stable, the other of the set voltage and the reset voltage serving as a second selected voltage is applied to the memory cell to turn the memory cell to an another resistance state different from the desired resistance state, and then the writing method returns to the step of applying the first selected voltage to the memory cell to turn the memory cell to the desired resistance state and obtaining the first read current of the memory cell,
   wherein a polarity of the disturbance voltage is different from a polarity of the first selected voltage, and an absolute value of the disturbance voltage is less than an absolute value of the second selected voltage.

2. The writing method of the resistive memory storage apparatus as claimed in claim 1, further comprising:
   increasing magnitude of the first selected voltage before applying the first selected voltage to the memory cell again.

3. The writing method of the resistive memory storage apparatus as claimed in claim 1, wherein the memory cell has a high resistance state before the first selected voltage is applied to the memory cell, the first selected voltage is the set voltage, and the second selected voltage is the reset voltage.

4. The writing method of the resistive memory storage apparatus as claimed in claim 3, the step of determining whether the desired resistance state of the memory cell is stable according to the comparison result comprises:
   determining the desired resistance state of the memory cell is not stable when the second read current is less than the first read current.

5. The writing method of the resistive memory storage apparatus as claimed in claim 1, wherein the memory cell has a low resistance state before the first selected voltage is applied to the memory cell, the first selected voltage is the reset voltage, and the second selected voltage is the set voltage.

6. The writing method of the resistive memory storage apparatus as claimed in claim 5, the step of determining whether the desired resistance state of the memory cell is stable according to the comparison result comprises:
   determining the desired resistance state of the memory cell is not stable when the second read current is greater than or equals to the first read current.

7. The writing method of the resistive memory storage apparatus as claimed in claim 1, wherein the absolute value of the disturbance voltage is greater than a threshold voltage of changing a resistance value of the memory cell.

8. A resistive memory storage apparatus, comprising:
   a memory cell array, comprising a memory cell; and
   a memory control circuit, coupled to the memory cell array, configured to:
   apply one of a set voltage and a reset voltage serving as a first selected voltage to the memory cell to turn the memory cell to a desired resistance state and obtain a first read current of the memory cell,
   after obtaining the first read current of the memory cell, apply a disturbance voltage to the memory cell without changing a resistance state of the memory cell and then apply a read voltage to obtain a second read current of the memory cell,
   compare the second read current to the first read current to obtain a comparison result, and
   determine whether the desired resistance state of the memory cell is stable according to the comparison result,
   wherein when the desired resistance state of the memory cell is determined as not stable, the memory control circuit applies the other of the set voltage and the reset voltage serving as a second selected voltage to the memory cell to turn the memory cell to an another resistance state different from the desired resistance state and then returns to the step of applying the first selected voltage to the memory cell to turn the memory cell to the desired resistance state and obtaining the first read current of the memory cell, and
   wherein a polarity of the disturbance voltage is different from a polarity of the first selected voltage, and an absolute value of the disturbance voltage is less than an absolute value of the second selected voltage.

9. The resistive memory storage apparatus as claimed in claim 8, wherein magnitude of the first selected voltage is increased before the memory control circuit applies the first selected voltage to the memory cell again.

10. The resistive memory storage apparatus as claimed in claim 8, wherein the memory cell has a high resistance state before the first selected voltage is applied to the memory cell, the first selected voltage is the set voltage, and the second selected voltage is the reset voltage.

11. The resistive memory storage apparatus as claimed in claim 10, wherein the memory control circuit is configured to determine that the desired resistance state of the memory cell is not stable when the second read current is less than the first read current.

12. The resistive memory storage apparatus as claimed in claim 8, wherein the memory cell has a low resistance state before the first selected voltage is applied to the memory cell, the first selected voltage is the reset voltage, and the second selected voltage is the set voltage.

13. The resistive memory storage apparatus as claimed in claim 12, wherein the memory control circuit is configured to determine that the desired resistance state of the memory cell is not stable when the second read current is greater than or equals to the first read current.

14. The resistive memory storage apparatus as claimed in claim 8, wherein the absolute value of the disturbance voltage is greater than a threshold voltage of changing a resistance value of the memory cell.

* * * * *